United States Patent
Gupta et al.

(10) Patent No.: US 9,128,862 B2
(45) Date of Patent: Sep. 8, 2015

(54) EFFICIENT CHECKSUMS FOR SHARED NOTHING CLUSTERED FILESYSTEMS

(75) Inventors: Karan Gupta, San Jose, CA (US); Renu Tewari, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 13/403,891

(22) Filed: Feb. 23, 2012

(65) Prior Publication Data

US 2013/0227379 A1    Aug. 29, 2013

(51) Int. Cl.
*G06F 11/00* (2006.01)
*G06F 11/10* (2006.01)
*H03M 13/09* (2006.01)
*H03M 13/29* (2006.01)

(52) U.S. Cl.
CPC .......... *G06F 11/1004* (2013.01); *H03M 13/09* (2013.01); *H03M 13/2906* (2013.01)

(58) Field of Classification Search
USPC ........................................................ 714/807
See application file for complete search history.

(56) References Cited

U.S. PATENT DOCUMENTS

| | | |
|---|---|---|
| 7,177,995 B2 | 2/2007 | Yagawa |
| 7,200,602 B2 | 4/2007 | Jonas |
| 7,457,796 B2 | 11/2008 | Lashley et al. |
| 7,917,695 B2 | 3/2011 | Ulrich et al. |
| 2003/0204529 A1* | 10/2003 | Hertling et al. ............... 707/200 |
| 2004/0093555 A1* | 5/2004 | Therrien et al. ............... 714/805 |
| 2007/0038913 A1* | 2/2007 | Allen et al. ..................... 714/758 |
| 2007/0162621 A1* | 7/2007 | Condorelli et al. ............... 710/1 |
| 2007/0226588 A1 | 9/2007 | Lee et al. |
| 2008/0089361 A1* | 4/2008 | Metcalf et al. ................ 370/474 |
| 2008/0140734 A1 | 6/2008 | Wagner |
| 2010/0306614 A1* | 12/2010 | Klim ............................. 714/752 |
| 2010/0318887 A1 | 12/2010 | Zvibel |

OTHER PUBLICATIONS

Author: Tom Made: Title: An Application of Group Testing to the File Comparison Problem; Date: 1989 IEEE CH2706-0/89/oooO/0237 1989 IEEE.*

* cited by examiner

*Primary Examiner* — April Y Blair
*Assistant Examiner* — Thien D Nguyen
(74) *Attorney, Agent, or Firm* — Lieberman & Brandsdorfer, LLC (57) ABSTRACT

Embodiments of the invention relate to efficiently employing checksums for shared nothing clustered filesystems. Tools are provided to compute the checksum in response to a read transaction and to utilize the computed checksum to prevent serving corrupted data. Multiple levels of data replication are provided. The checksum computation functions within the multiple levels and addresses a specified data block that is the subject of the read transaction.

20 Claims, 8 Drawing Sheets

EFFICIENT CHECKSUMS FOR SHARED NOTHING CLUSTERED FILESYSTEMS

BACKGROUND

This invention relates to an efficient approach for utilization of checksum to support both read and write transactions. More specifically, the invention relates to a filesystem having at least two levels of data replication and utilization of the checksum technique with multiple levels of data replication.

A checksum or hash is a fixed size datum computed from an arbitrary block of digital data for the purpose of detecting accidental errors that may have been introduced during transmission or storage. Every I/O operation on a storage device or network carries with it a small chance of introducing errors into the data that it is reading or writing. Current use of a checksum computation for a write transaction computes the checksum on a defined block size and stores the computed checksum in persistent storage and separate from the subject data. Similarly, current use of a checksum computation for a read transaction includes reading a designated block of data and computes the checksum, reading a stored checksum value, and comparing the computed checksum with the stored checksum value.

The checksum is employed to ensure data integrity. Although there is a convenience factor associated with use of the checksum, there are performance degradation issues associated with current uses of the checksum for both read and write transactions.

BRIEF SUMMARY

This invention comprises a method, system, and article for efficient checksums for shared nothing clustered filesystems.

In one aspect, a computer implemented method is provided for efficient checksum implementation. A write transaction is amplified to three or more levels of amplification. A first read transaction is issued to a first data block at a first replication level. The issuance of the first read transaction includes computing a first checksum on a first read block of the first read transaction. In addition, a second read checksum is issued on the first read block of the first read transaction at the second of the three or more levels of replication. Once the first and second read checksums have issued, the first and second read checksums are compared. The aspect of comparing includes serving data associated with the first transaction if the first and second read checksums match. However, if there is no match, a third read checksum is issued on the first read block of the first read transaction at a third of the three or more levels of replication.

In another aspect, a system is provided with tools to support efficient use of checksums for shared nothing clustered filesystems. A processor is provided in communication with memory. In addition, a functional unit is provided in communication with the memory. The functional unit includes tools to support completion of a read transaction. The tools include an amplification manager, a first read manager, a second read manager, a third read manager, and a comparison manager. The amplification manager functions to amplify a write transaction. In one embodiment, the amplification manager amplifies the write transaction to three or more levels of replication. The first read manager issues a first read transaction to a first data block at a first replication level. The first read transaction includes computation of a first checksum on the first read block of the first read transaction. The second read manager computes a second read checksum on the first read block of the first read transaction at a second replication level. The comparison manager functions to compare the first and second checksums. If the first and second checksums match, the comparison manager serves data associated with the first read transaction at the first replication level. However, if the first and second checksums do not match, the third read manager computes a third read checksum on the first read block of the first read transaction at a third of the three or more levels of replication.

In a further aspect, a computer program product is provided for implementation of efficient checksums. The computer program product comprises a computer readable storage medium having computer readable program code embodied therewith. Computer readable program code is configured to amplify a write transaction, including three or more levels of replication. Computer readable program code is provided to issues a first read transaction to a first data block at a first of the three or more levels of replication. The issuance of the first read transaction includes computing a first read checksum on a first read block of the first read transaction. Computer readable program code is also provided to issue a second read checksum on the first read block of the first read transaction at a second of the three or more levels of replication. Based upon the issuance of the first and second read checksums, computer readable program code is provided to compare the checksums. More specifically, if the first and second checksums match, then data associated with the first read transaction is served. However, if the first and second checksums do not match, then instructions are provided to issue a third read checksum on the first read block of the first read transaction at a third replication level.

Other features and advantages of this invention will become apparent from the following detailed description of the presently preferred embodiment of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

The functional unit(s) described in this specification has been labeled with tools in the form of managers. A manager may be implemented in programmable hardware devices such as field programmable gate arrays, programmable array logic, programmable logic devices, or the like. The managers may also be implemented in software for processing by various types of processors. An identified manager of executable code may, for instance, comprise one or more physical or logical blocks of computer instructions which may, for instance, be organized as an object, procedure, function, or other construct. Nevertheless, the executables of an identified manager need not be physically located together, but may comprise disparate instructions stored in different locations which, when joined logically together, comprise the managers and achieve the stated purpose of the managers.

Indeed, a manager of executable code could be a single instruction, or many instructions, and may even be distributed over several different code segments, among different applications, and across several memory devices. Similarly, operational data may be identified and illustrated herein within the manager, and may be embodied in any suitable form and organized within any suitable type of data structure. The operational data may be collected as a single data set, or may be distributed over different locations including over different storage devices, and may exist, at least partially, as electronic signals on a system or network.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of an application manager, a replication manager, a migration manager, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
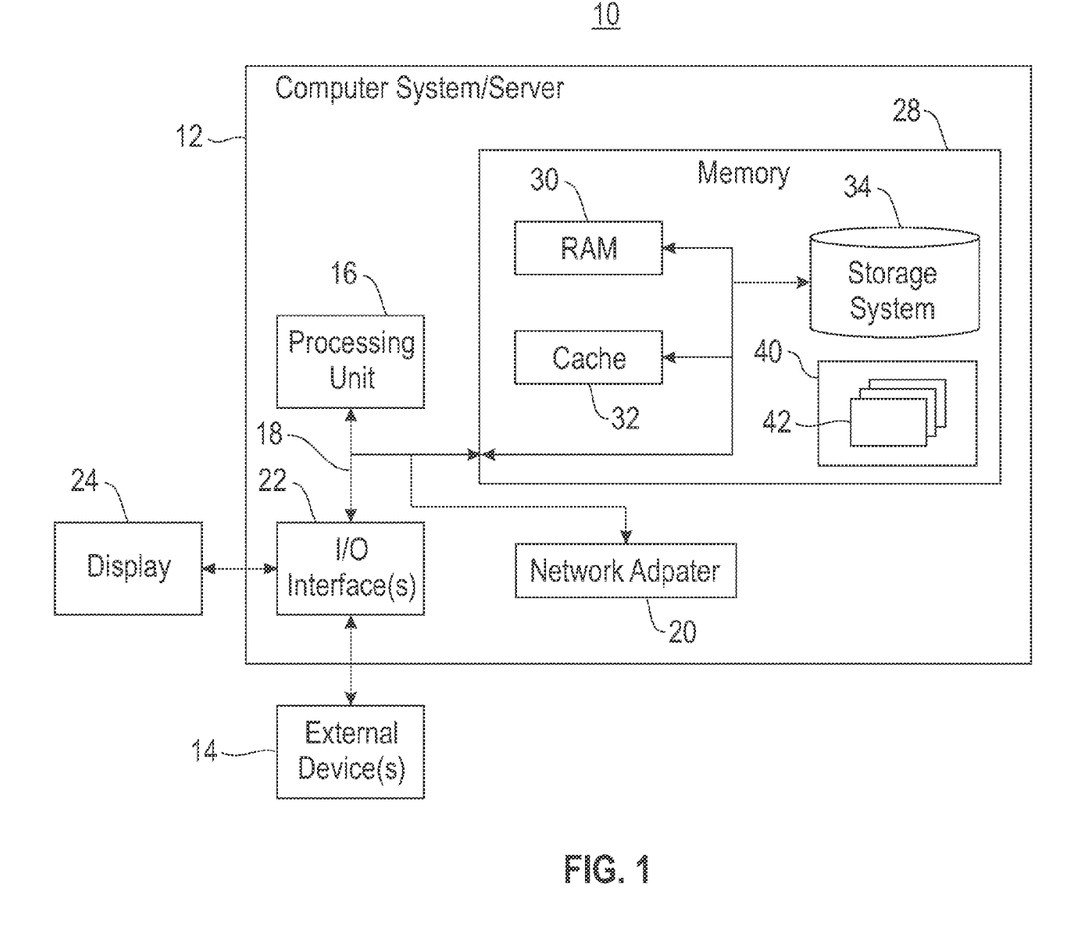
FIG. 1 depicts a cloud computing node according to an embodiment of the present invention.

A cloud computing environment is service oriented with a focus on statelessness, low coupling, modularity, and semantic interoperability. At the heart of cloud computing is an infrastructure comprising a network of interconnected nodes. Referring now to FIG. 1, a schematic of an example of a cloud computing node is shown. Cloud computing node (10) is only one example of a suitable cloud computing node and is not intended to suggest any limitation as to the scope of use or functionality of embodiments of the invention described herein. Regardless, cloud computing node (10) is capable of being implemented and/or performing any of the functionality set forth hereinabove. In cloud computing node (10) there is a computer system/server (12), which is operational with numerous other general purpose or special purpose computing system environments or configurations. Examples of well-known computing systems, environments, and/or configurations that may be suitable for use with computer system/server (12) include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server (12) may be described in the general context of computer system-executable instructions, such as program modules, being executed by a computer system. Generally, program modules may include routines, programs, objects, components, logic, data structures, and so on that perform particular tasks or implement particular abstract data types. Computer system/server (12) may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server (12) in cloud computing node (10) is shown in the form of a general-purpose computing device. The components of computer system/server (12) may include, but are not limited to, one or more processors or processing units (16), a system memory (28), and a bus (18) that couples various system components including system memory (28) to processor (16). Bus (18) represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server (12) typically includes a variety of computer system readable media. Such media may be any available media that is accessible by computer system/server (12), and it includes both volatile and non-volatile media, removable and non-removable media.

System memory (28) can include computer system readable media in the form of volatile memory, such as random access memory (RAM) (30) and/or cache memory (32). Computer system/server (12) may further include other removable/non-removable, volatile/non-volatile computer system storage media. By way of example only, storage system (34) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (18) by one or more data media interfaces. As will be further depicted and described below, memory (28) may include at least one program product having a set (e.g., at least one) of program modules that are configured to carry out the functions of embodiments of the invention.

Program/utility (40), having a set (at least one) of program modules (42), may be stored in memory (28) by way of example, and not limitation, as well as an operating system, one or more application programs, other program modules, and program data. Each of the operating systems, one or more application programs, other program modules, and program data or some combination thereof, may include an implementation of a networking environment. Program modules (42) generally carry out the functions and/or methodologies of embodiments of the invention as described herein.

Computer system/server (12) may also communicate with one or more external devices (14), such as a keyboard, a pointing device, a display (24), etc.; one or more devices that enable a user to interact with computer system/server (12); and/or any devices (e.g., network card, modem, etc.) that enable computer system/server (12) to communicate with one or more other computing devices. Such communication can occur via Input/Output (I/O) interfaces (22). Still yet, computer system/server (12) can communicate with one or more networks such as a local area network (LAN), a general wide area network (WAN), and/or a public network (e.g., the Internet) via network adapter (20). As depicted, network adapter (20) communicates with the other components of computer system/server (12) via bus (18). It should be understood that although not shown, other hardware and/or software components could be used in conjunction with computer system/server (12). Examples, include, but are not limited to: microcode, device drivers, redundant processing units, external disk drive arrays, RAID systems, tape drives, and data archival storage systems, etc.

Figure 2:
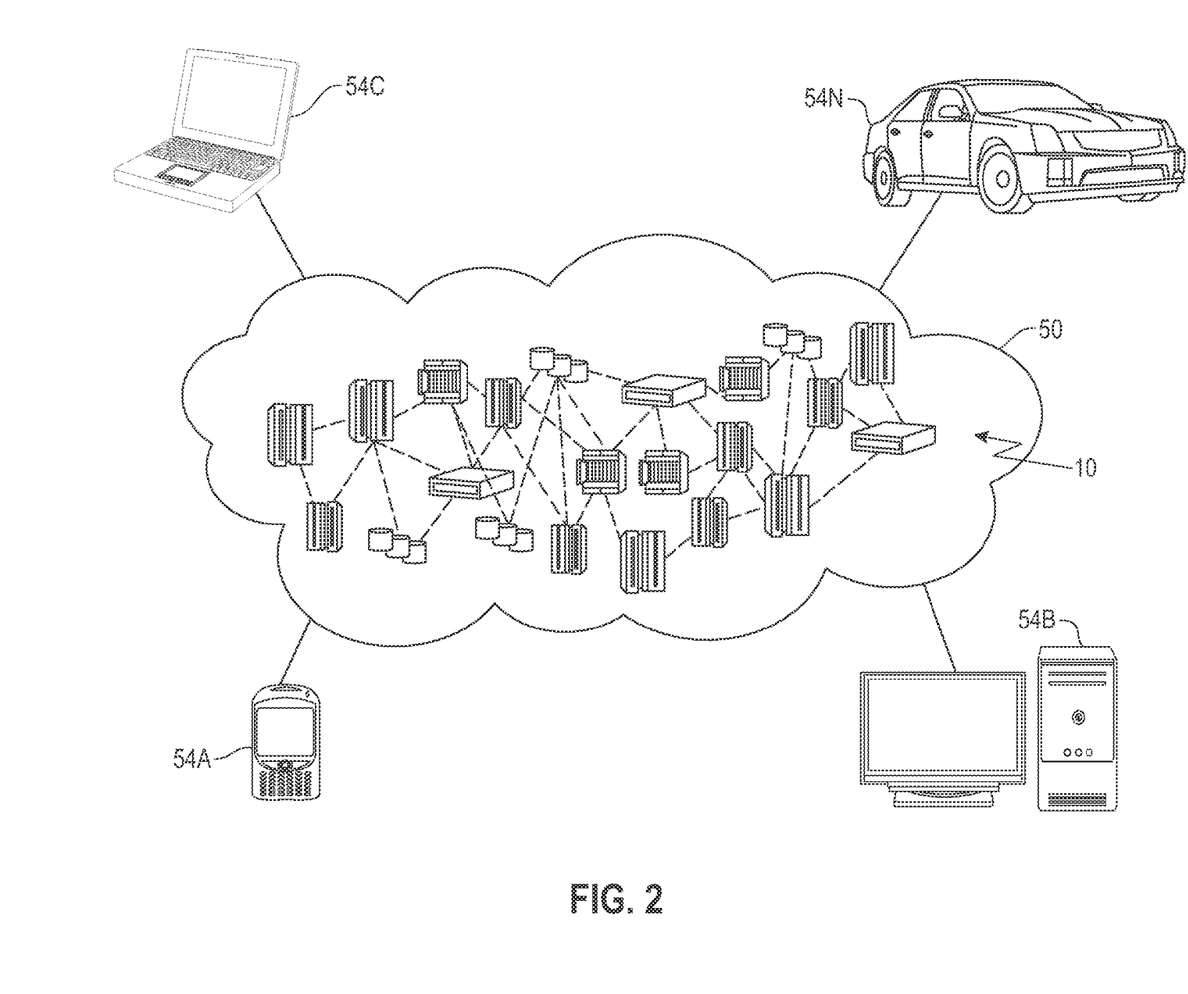
FIG. 2 depicts a cloud computing environment according to an embodiment of the present invention.

Referring now to FIG. 2, illustrative cloud computing environment (50) is depicted. As shown, cloud computing environment (50) comprises one or more cloud computing nodes (10) with which local computing devices used by cloud consumers, such as, for example, personal digital assistant (PDA) or cellular telephone (54A), desktop computer (54B), laptop computer (54C), and/or automobile computer system (54N) may communicate. Nodes (10) may communicate with one another. They may be grouped (not shown) physically or virtually, in one or more networks, such as Private, Community, Public, or Hybrid clouds as described hereinabove, or a combination thereof. This allows cloud computing environment (50) to offer infrastructure, platforms and/or software as services for which a cloud consumer does not need to maintain resources on a local computing device. It is understood that the types of computing devices (54A)-(54N) shown in FIG. 2 are intended to be illustrative only and that computing nodes (10) and cloud computing environment (50) can communicate with any type of computerized device over any type of network and/or network addressable connection (e.g., using a web browser).

Figure 3:
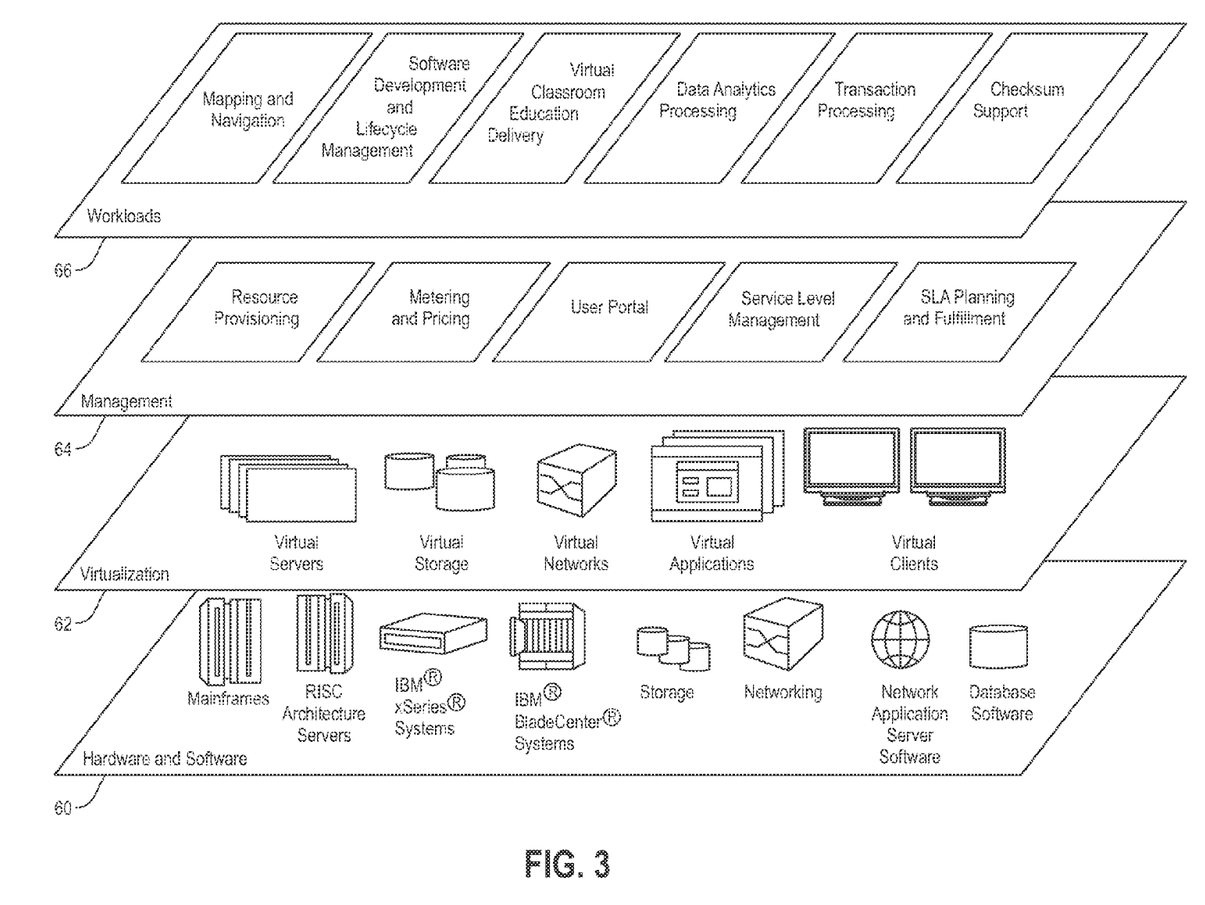
FIG. 3 depicts abstraction model layers according to an embodiment of the present invention.

Referring now to FIG. 3, a set of functional abstraction layers provided by cloud computing environment (50) is shown. It should be understood in advance that the components, layers, and functions shown in FIG. 3 are intended to be illustrative only and embodiments of the invention are not limited thereto. As depicted, the following layers and corresponding functions are provided: hardware and software layer (60), virtualization layer (62), management layer (64), and workload layer (66). The hardware and software layer (60) includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer (62) provides an abstraction layer from which the following examples of virtual entities may be provided: virtual servers; virtual storage; virtual networks, including virtual private networks; virtual applications and operating systems; and virtual clients.

In one example, management layer (64) may provide the following functions: resource provisioning, metering and pricing, user portal, service level management, and SLA planning and fulfillment. The functions are described below. Resource provisioning provides dynamic procurement of computing resources and other resources that are utilized to perform tasks within the cloud computing environment. Metering and pricing provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provides pre-arrangement for, and procurement of, cloud computing resources for which a future requirement is anticipated in accordance with an SLA.

Workloads layer (66) provides examples of functionality for which the cloud computing environment may be utilized. Examples of workloads and functions which may be provided from this layer include, but is not limited to: mapping and navigation, software development and lifecycle management, virtual classroom education delivery, data analytics processing, transaction processing, and efficient use of checksum functionality associated with one or more read transactions within the cloud computing environment.

A shared nothing clustered filesystem architecture is a distributed computing architecture in which each server, i.e. node, is self-sufficient. Tasks are divided up between these independent servers and no one server waits on the other. More specifically, a common filesystem and namespace are employed across disparate computing platforms, thereby streamlining processes and reducing disk space. In one embodiment, the shared nothing clustered filesystem is deployed in the shared pool of configurable computer resources described herein, hereinafter referred to as a cloud computing environment. Files may be shared among users within multiple data centers, also referred to herein as data sites.

A checksum mechanism is used to efficiently mitigate errors associated with transactions in the SNC. With the checksum, a value is used to ensure data is stored or transmitted without errors. More specifically, the checksum value is created by calculating a binary value in a block of data using an algorithm. One checksum value may be compared against a second checksum value to determine if there is a match. A non-match indicates an error. Accordingly, the checksum tests a block of data for error detection.

Figure 4:
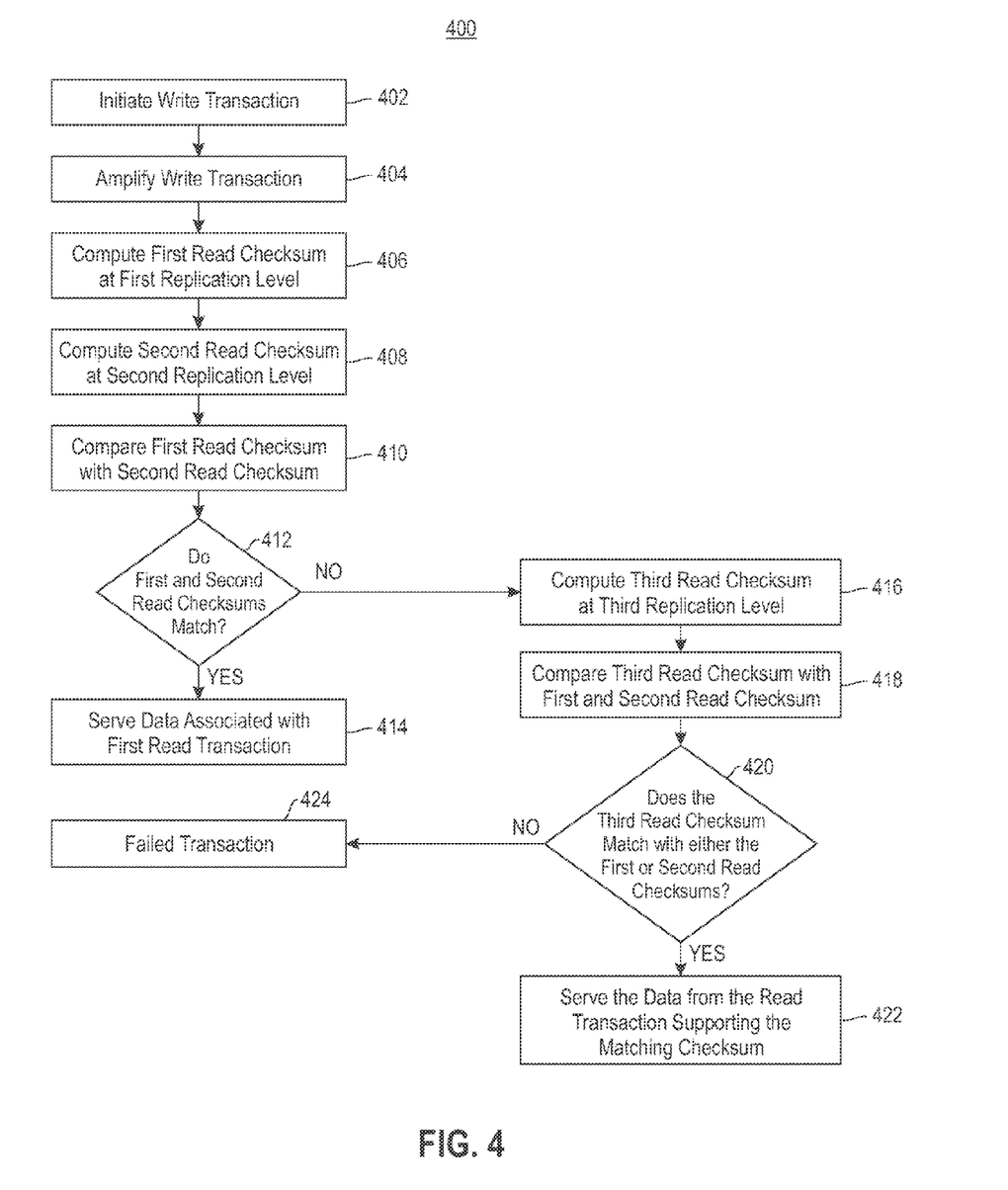
FIG. 4 depicts a flow chart illustrating a process for employing the checksum with a read transaction.

Using the checksum in the SNC is challenging due to the distributed nature of the nodes. More specifically, the concerns pertain to a location for storing the checksum and expense associated with maintaining a checksum log or reading a checksum value from a remote location. In the SNC, it is common to employ commodity devices and to amplify write transactions in an effort to mitigate errors in the event of failure of one or more of the commodity devices. FIG. 4 is a flow chart (400) illustrating a process for employing the checksum with a read transaction. As shown, a write transaction is initiated (402) and amplified (404). The amplification includes a minimum of three levels of replication in the SNC. In one embodiment, the amplification includes a separate node for each replication level. A first read transaction is issued to a first data block at a first replication level (406). Issuance of the first read transaction at step (406) includes computing a first checksum on the first read block of the first read transaction. Since the effect of the checksum is embodied in a comparison test, a second read checksum is computed on the first read block of the first read transaction at a second replication level (408). Accordingly, the first part in the comparison process is to compute the first and second read checksums.

Following step (408), the first read checksum is compared with the second read checksum (410) and it is determined if the first and second read checksums match (412). A positive response to the determination at step (412) is followed by serving the data associated with the first read transaction to the requesting client (414). Conversely, a negative response to the determination at step (412) is followed by computing a third checksum on the first data block at a third replication level (416). In one embodiment, the issuance of the third checksum only takes place when there is a mismatch between the first and second checksums. Following step (416), the third checksum is compared to both the first checksum and the second checksum (418), and it is determined if the third checksum matches with either the first or second read checksums (420). If there is a match with the third checksum, the matching data may be served to the client machine from the read transaction supporting the matching checksum (422). However, if the third checksum does not match with either of the first or second checksums, then there is a failed transaction (424). Accordingly, in the event of a mismatch between the first and second checksums, the third checksum is employed as a decision maker for either returning a match or determination of a failed transaction.

Figure 5:
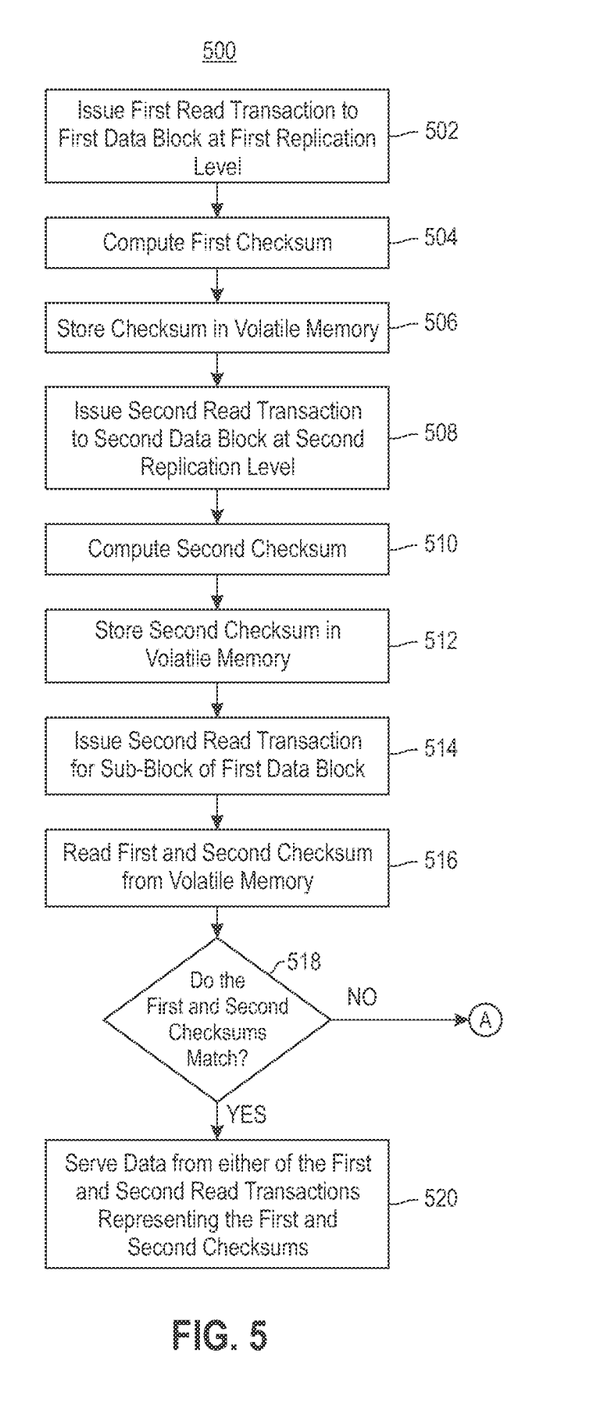
FIG. 5 depicts a flow chart illustrating a process for supporting a second read transaction for a sub-block of the first data block.

Each of the checksums illustrated above are computed on a data block of a read transaction at a specified replication level and is limited to a read path associated with the read transaction. Specifically, the first checksum is on a read transaction at the first replication level, the second checksum is on a read transaction at the second replication level, the third checksum is on a read transaction at the third replication level, etc. In one embodiment, the checksum data is stored in volatile memory, e.g. storage cache. FIG. 5 is a flow chart (500) illustrating a process for supporting a second read transaction for a sub-block of the first data block. As shown, a first read transaction is issued to a first data block at a first replication level (502), and a first checksum on the first read block of the first read transaction is computed (504). The first checksum is stored in volatile memory (506). A second read transaction is issued to a second data block at a second replication level (508) and a second checksum on the first read block of the first read transaction is computed (510). The second checksum is stored in volatile memory (512). A second read transaction is issued for a sub-block of the first data block (514). Instead of computing another checksum, the associated checksum is read from volatile memory for both the first and second checksums that support the sub-block of the first data block (516). Accordingly, by storing checksum data in volatile memory, efficiency is supported in that a secondary computation is not required and a remote transaction is not required.

Following step (516), it is determined if the first and second checksums from the volatile memory match (518). A positive response to the determination at step (518) is followed by serving the matching data to the client machine from either of the read transactions representing the matching checksums (520). However, if the first and second checksums do not match, it is then determined if there is a third checksum in volatile memory (522). A positive response to the determination at step (522) is followed by comparing the third checksum to both the first and second checksums (524). It is then determined if there is a match of either or both of the first and second checksums with the third checksum (526). If there is a match with the third checksum, the matching data may be served to the client machine from either of the matching checksums (528); if the third checksum does not match with either of the first or second checksums, then the transaction is determined to be a failed transaction (530). A negative response to the determination at step (522) is followed by computing a third checksum on the first data block at a third replication level (532) and a return to step (524). Accordingly, the checksum data may be stored in volatile memory so support efficiency of future read transactions on sub-blocks of the subject data block.

As demonstrated in FIGS. 4 and 5, the checksum is implemented on the read transaction. There is no change on the write path with the checksum. Similarly, there is no non-local data transfer in the path of the read transaction. Furthermore, as demonstrated in FIG. 5, the checksum data may be stored in volatile memory to support future read transactions on the data block or a sub-block of the data block. The aspect of storing the checksum in cache effectively masks any performance hit for the read transaction on the sub-block, e.g. small read transaction.

Figure 6:
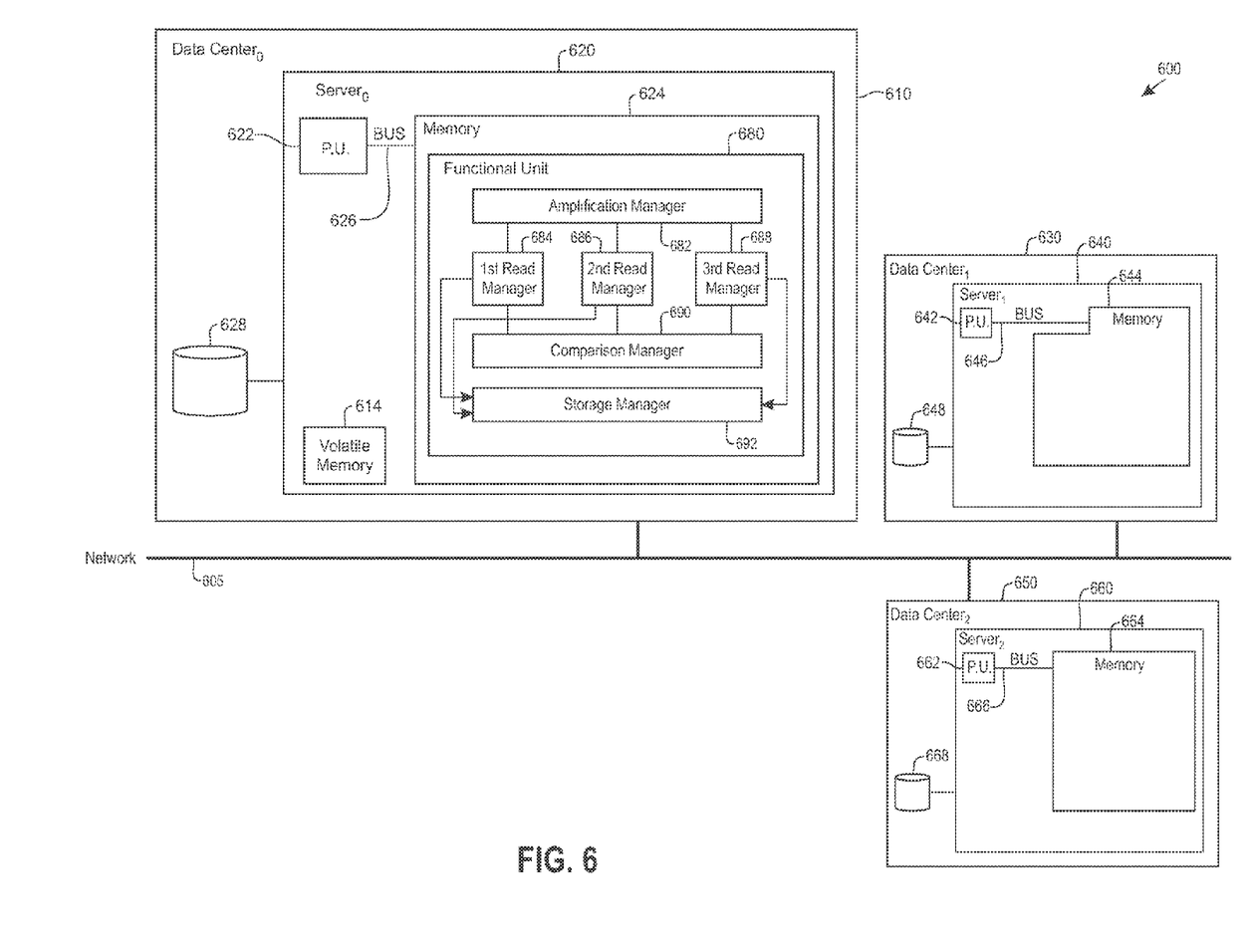
FIG. 6 depicts a block diagram illustrating tools embedded in a computer system for checksum creation and management within a shared group of resources.

As shown in FIGS. 4-5, a method is provided to support use of a checksum mechanism implementation in a shared nothing clustered filesystem while mitigating performance degradation. The data replication at a minimum of three levels, together with the manner in which the checksum is implemented, mitigates access to and use of corrupted data. FIG. 6 is a block diagram (600) illustrating tools embedded in a computer system to support the technique employed for the checksum mechanism in the shared nothing clustered filesystem. Specifically, a shared pool of configurable computer resources is shown with a first node (610), a second node (630), and a third node (650). Although three nodes are shown in the example herein, the invention should not be limited to this quantity of nodes in the computer system. Each of the nodes represents a computing resource. As shown herein, each of the nodes (610), (630), and (650) are represented in separate data centers in the shared pool. However, in one embodiment, at least one of the nodes may be located in the same data center as a separate node. Accordingly, one or more data centers may be employed to support efficient use of the checksum mechanism to mitigate use of corrupted data.

Each of the data centers in the system is provided with at least one server in communication with data storage. More specifically, the first data center (610) is provided with a first server (620) having a processing unit (622), in communication with memory (624) across a bus (626), and in communication with data storage (628); the second data center (630) is provided with a second server (640) having a processing unit (642), in communication with memory (644) across a bus (646), and in communication with second local storage (648); and the third data center (650) is provided with a third server (660) having a processing unit (662), in communication with memory (664) across a bus (666), and in communication with third local storage (668). Communication among the data center is supported across one or more network connections (605).

In a shared pool of configurable computer resources, including the first data center (610), the second data center (630), and the third data center (650), a functional unit (680) is provided with one or more tools to support the implementation and management of the checksum in a shared pool of resources. The functional unit (680) is shown local to the first data center (610). However, in one embodiment, the functional unit (680) may be local to any of the data centers supporting the clustered filesystem. The tools include, but are not limited to, an amplification manager (682), a first read manager (684), a second read manager (686), a third read manager (688), a comparison manager (690), and a storage manager (692). The amplification manager (682) is provided in the shared pool to manage access of a shared file. More specifically, the amplification manager (682) is responsible for amplification of a write transaction to include three or more levels of replication. In one embodiment, a first level of replication is local to the first data center (610), the second level of replication is local to the second data center (630), and the third level of replication is local to the third data center (650). By supporting multiple levels of replication, data availability is increased. Accordingly, in the event of failure of one of the data centers, one of the replications will continue to be available at one or more of the data centers supporting the respective replication levels.

A read transaction associated with the replication levels is supported by at least two read managers, one for each of two replication levels. The first read manager (684) is configured to issue a first read transaction to a first data block at the first replication level. The issuance of the first read transaction includes the first read manager (684) computing a first checksum on a first read block of the first read transaction. The first checksum transaction on the first replication level is limited to a read path associated with the first read transaction. In addition, the second read manager (686) computes a second checksum on the first read block of the first read transaction at the second level of replication. Similar to the first checksum, the second checksum transaction on the second replication level is limited to a read path associated with the read transaction. As such, there are two checksum values that are available for evaluation, each at a different node and independently computed by a separate manager.

The comparison manager (690) is provided in communication with both the first and second read managers (684) and (686), respectively. More specifically, the comparison manager (690) is provided to compare the computed values associated with the first and second checksums. If the comparison of the first and second checksums returns a match of the two checksum values, then the comparison manager (690) serves the data associated with the first read transaction from either the first or second level of replication. However, if the comparison does not return a match of the two checksum values, then the third read manager (688) is employed. More specifically, the third read manager (688) computes a third checksum on the first read block of the first read transaction at the third level of replication. In one embodiment, the third checksum is only invoked in the event of a mismatch between two compared checksum values. Accordingly, the third checksum serves as an arbitrator of the first and second checksum values.

Based upon the determined mismatch of two checksum value and the availability of the third checksum, the comparison manager (690) compares the first checksum with the third checksum and also compares the second checksum with the third checksum. If either of the comparisons associated with the third checksum returns a match, e.g. a match of the first and third checksums or a match of the second and third checksums, then the comparison manager (690) serves the data associated with the matching checksum from either the first or second level of replication. However, if the comparison does not return a match between the third checksum and either of the first and second checksum values, then a failed transaction is returned. Accordingly, the third checksum at a different replication level from the first and second checksums functions to break a tie associated with a mismatch of the first and second checksums.

The functional unit (680), shown local to the first data center (610), is in communication with volatile memory (614a), e.g. storage cache, local to the first data center. The storage manager (692) is in communication with each of the read managers (684), (686), and (688). The storage manager (692) stores each of the first checksum, the second checksum, and the third checksum in the volatile memory (614). Each of the first, second, and third checksums are related to the first read transaction on the first data block. In the event of a second read transaction for a sub-block of the first data block, the storage manager (692) may read and utilize the first, second, and third checksums stored in volatile memory (614), thereby eliminating the need for the read manager to compute a new set of checksums for the sub-block of the first data block. Accordingly, volatile storage may be employed as an efficient storage location of the checksums in the event of a repeated data read transaction for the same data block or sub-block of the data block.

As identified above, the amplification manager (682), first read manager (684), second read manager (686), third read manager (688), comparison manager (690), and storage manager (692), respectively, are shown residing in memory (624) of the server (620) local to the first data center (610). Although in one embodiment, the amplification, first read, second read, third read, comparison, and storage managers, respectively, may reside as hardware tools external to the memory (624) of server (620) of the first data center (610), they may be implemented as a combination of hardware and software, or may reside local to the second data center (630) or the third data center (650) in the shared pool of resources. Similarly, in one embodiment, the managers may be combined into a single functional item that incorporates the functionality of the separate items. As shown herein, each of the manager(s) are shown local to one data center. However, in one embodiment they may be collectively or individually distributed across the shared pool of configurable computer resources and function as a unit to manage efficient use and implantation of data checksums for shared nothing clusters. Accordingly, the managers may be implemented as software tools, hardware tools, or a combination of software and hardware tools.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
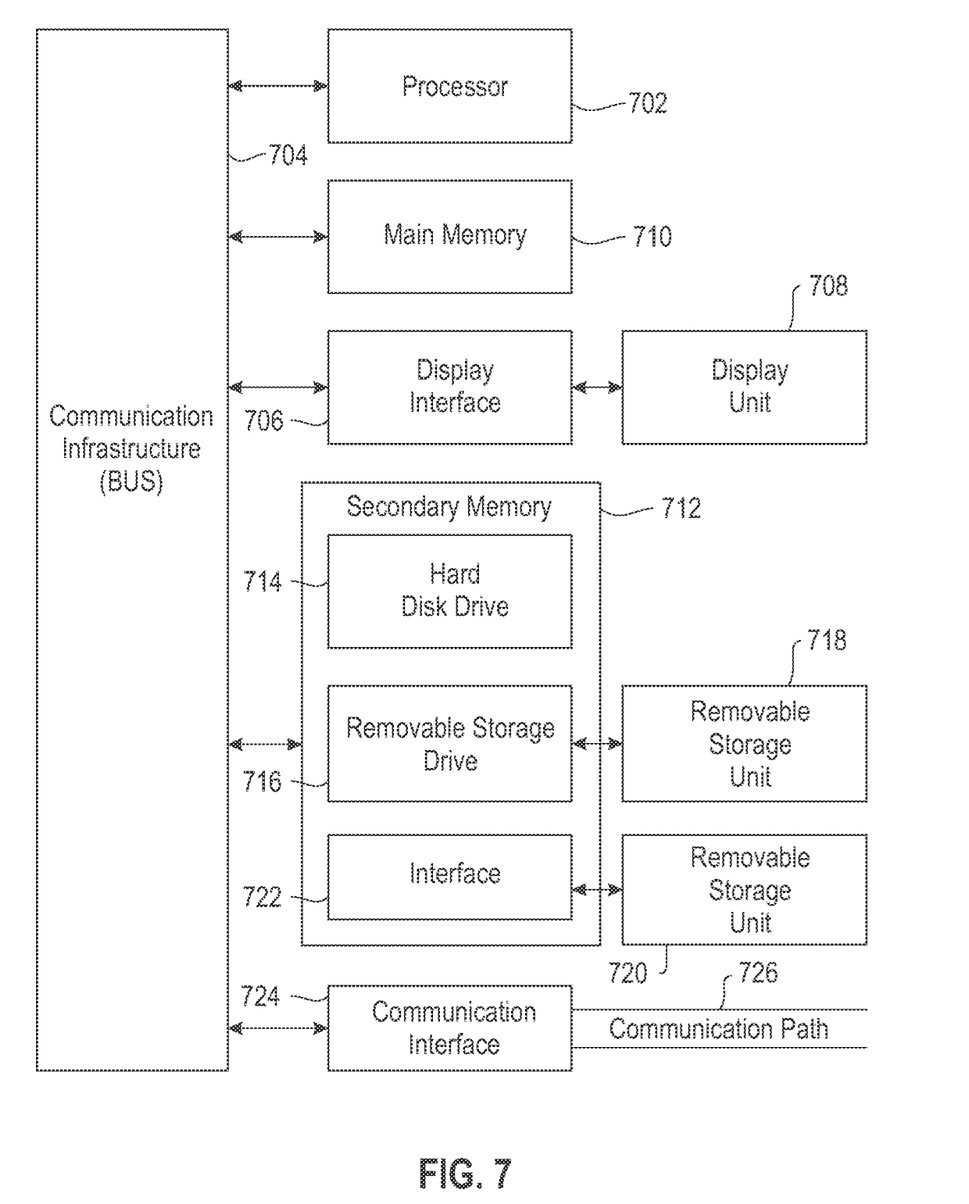
FIG. 7 depicts a block diagram showing a system for implementing an embodiment of the present invention.

Referring now to FIG. 7 is a block diagram (700) showing a system for implementing an embodiment of the present invention. The computer system includes one or more processors, such as a processor (702). The processor (702) is connected to a communication infrastructure (704) (e.g., a communications bus, cross-over bar, or network). The computer system can include a display interface (706) that forwards graphics, text, and other data from the communication infrastructure (704) (or from a frame buffer not shown) for display on a display unit (708). The computer system also includes a main memory (710), preferably random access memory (RAM), and may also include a secondary memory (712). The secondary memory (712) may include, for example, a hard disk drive (714) and/or a removable storage drive (716), representing, for example, a floppy disk drive, a magnetic tape drive, or an optical disk drive. The removable storage drive (716) reads from and/or writes to a removable storage unit (718) in a manner well known to those having ordinary skill in the art. Removable storage unit (718) represents, for example, a floppy disk, a compact disc, a magnetic tape, or an optical disk, etc., which is read by and written to by removable storage drive (716). As will be appreciated, the removable storage unit (718) includes a computer readable medium having stored therein computer software and/or data.

In alternative embodiments, the secondary memory (712) may include other similar means for allowing computer programs or other instructions to be loaded into the computer system. Such means may include, for example, a removable storage unit (720) and an interface (722). Examples of such means may include a program package and package interface (such as that found in video game devices), a removable memory chip (such as an EPROM, or PROM) and associated socket, and other removable storage units (720) and interfaces (722) which allow software and data to be transferred from the removable storage unit (720) to the computer system.

The computer system may also include a communications interface (724). Communications interface (724) allows software and data to be transferred between the computer system and external devices. Examples of communications interface (724) may include a modem, a network interface (such as an Ethernet card), a communications port, or a PCMCIA slot and card, etc. Software and data transferred via communications interface (724) are in the form of signals which may be, for example, electronic, electromagnetic, optical, or other signals capable of being received by communications interface (724). These signals are provided to communications interface (724) via a communications path (i.e., channel) (726).

This communications path (726) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (710) and secondary memory (712), removable storage drive (716), and a hard disk installed in hard disk drive (714).

Computer programs (also called computer control logic) are stored in main memory (710) and/or secondary memory (712). Computer programs may also be received via a communication interface (724). Such computer programs, when run, enable the computer system to perform the features of the present invention as discussed herein. In particular, the computer programs, when run, enable the processor (702) to perform the features of the computer system. Accordingly, such computer programs represent controllers of the computer system.

The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, the enhanced cloud computing model supports flexibility with respect to application processing and disaster recovery, including, but not limited to, supporting separation of the location of the data from the application location and selection of an appropriate recovery site.

Alternative Embodiment

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A method comprising:
amplifying a write transaction, the amplification including at least three levels of replication, wherein each level of replication occurs at a separate node;
issuing a first read transaction to a first data block at a first replication level, including computing a first read checksum on a first read block of the first read transaction;
computing a second read checksum on the first read block of the first read transaction at a second replication level;
comparing the first checksum to the second checksum to determine if the first checksum matches the second checksum, and, in response to determining a mismatch of the first checksum and the second checksum, computing a third read checksum on the first read block of the first read transaction at a third replication level;
comparing the third checksum to both the first and second checksums to determine if the third checksum matches at least one of the first and second checksums;
storing each of the first, second, and third checksums in volatile memory;
serving data associated with the first read transaction from any replication level associated with a matching read checksum;
issuing a second read transaction for a sub-block of the first data block; and
in response to issuing the second read transaction, comparing the first checksum to the second checksum to determine if the first checksum matches the second checksum, wherein comparing the first checksum to the second checksum includes reading the stored first and second checksums from the volatile memory.

2. The method of claim 1, further comprising serving data associated with the second checksum in response to determining that the second checksum matches the third checksum.

3. The method of claim 1, further comprising determining a failed transaction in response to determining a mismatch of the third checksum with both the first and second checksums.

4. The method of claim 1, wherein computation of the first, second, and third checksums is limited to a read path associated with the read transaction.

5. The method of claim 1, further comprising, in response to determining a mismatch of the first checksum and the second checksum, comparing the third checksum to both the first and second checksums, wherein comparing the third checksum to both the first and second checksums includes reading the stored first, second, and third checksums from the volatile memory.

6. A system comprising:
a processor in communication with memory;

a functional unit in communication with the memory, the functional unit comprising tools to support completion of a read transaction, the tools comprising:

an amplification manager to amplify a write transaction, an associated amplification of the write transaction including at least three levels of replication, wherein each level of replication occurs at a separate node;

a first read manager to issue a first read transaction to a first data block at a first replication level, including the first read manager to compute a first read checksum on a first read block of the first read transaction;

a second read manager to compute a second read checksum on the first read block of the first read transaction at a second replication level;

a comparison manager in communication with both the first read manager and the second read manager, the comparison manager to compare the first checksum and the second checksum to determine if the first checksum matches the second checksum, and, in response to determining a mismatch of the first checksum and the second checksum, the comparison manager to instruct a third read manager to compute a third read checksum on the first read block of the first read transaction at a third replication level and compare the third checksum to both the first and second checksums to determine if the third checksum matches at least one of the first and second checksums;

a storage manager in communication with each of the read managers, the storage manager to store each of the first, second, and third read checksum data in volatile memory;

the comparison manager to serve data associated with the first read transaction from any replication level with a matching read checksum;

the first read manager to issue a second read transaction for a sub-block of the first data block; and in response to issuing the second read transaction, the comparison manager to compare the first checksum to the second checksum to determine if the first checksum matches the second checksum, wherein comparing the first checksum to the second checksum includes reading the stored first and second checksums from the volatile memory.

7. The system of claim 6, further comprising the comparison manager to serve data associated with the second checksum in response to determining that matches the second checksum matches the third checksum.

8. The system of claim 6, further comprising the comparison manager to determine a failed transaction in response to determining a mismatch of the third checksum with both the first and second checksums.

9. The system of claim 6, wherein computation of the first, second, and third checksums is limited to a read path associated with the read transaction.

10. The system of claim 6, further comprising, in response to determining a mismatch of the first checksum and the second checksum, the comparison manager to compare the third checksum to both the first and second checksums, wherein comparing the third checksum to both the first and second checksums includes the storage manager to read the stored first, second, and third checksums from the volatile memory.

11. A computer program product comprising a computer readable non-transitory storage medium having computer readable program code embodied therewith, the computer readable program code when executed on a computer causes the computer to:

amplify a write transaction, the amplification including at least three levels of replication, wherein each level of replication occurs at a separate node;

issue a first read transaction to a first data block at a first replication level, including computing a first read checksum on a first read block of the first read transaction;

compute a second read checksum on the first read block of the first read transaction at a second replication level;

compare the first checksum and the second checksum to determine if the first checksum matches the second checksum, and, in response to determining a mismatch of the first checksum and the second checksum, compute a third read checksum on the first read block of the first read transaction at a third replication level;

compare the third checksum to both the first and second checksums to determine if the third checksum matches at least one of the first and second checksums; and store each of the first, second, and third read checksum data in volatile memory;

serve the data associated with the first read transaction from any replication level associated with a matching checksum;

issue a second read transaction for a sub-block of the first data block; and in response to issuing the second read transaction, compare the first checksum to the second checksum to determine if the first checksum matches the second checksum, wherein comparing the first checksum to the second checksum includes reading the stored first and second checksums from the volatile memory.

12. The computer program product of claim 11, further comprising program code to serve data associated with the second checksum in response to determining that the second checksum matches the third checksum.

13. The computer program product of claim 11, further comprising determining a failed transaction in response to determining a mismatch of the third checksum with both the first and second checksums.

14. The computer program product of claim 11, wherein computation of the first, second, and third checksums is limited to a read path associated with the read transaction.

15. The computer program product of claim 11, further comprising, in response to determining a mismatch of the first checksum and the second checksum, comparing the third checksum to both the first and second checksums, wherein comparing the third checksum to both the first and second read checksums includes reading the stored first, second, and third checksums from the volatile memory data.

16. The method of claim 1, wherein the amplification is in a shared nothing clustered filesystem.

17. The method of claim 16, further comprising the first replication level being local to a first server in the filesystem and the second replication level being local to a second server in the filesystem, wherein the first and second servers are separate computing resources in the shared nothing clustered filesystem.

18. The system of claim 6, wherein the amplification is in a shared nothing clustered filesystem.

19. The system of claim 18, further comprising the first replication level being local to a first server in the filesystem and the second replication level being local to a second server in the filesystem, wherein the first and second servers are separate computing resources in the shared nothing clustered filesystem.

20. The computer program product of claim 11, wherein the amplification is in a shared nothing clustered filesystem.

* * * * *